United States Patent [19]

Krempl et al.

[11] Patent Number: 5,010,302

[45] Date of Patent: Apr. 23, 1991

[54] CHARGE AMPLIFIER CIRCUIT

[75] Inventors: Peter W. Krempl, Kainbach; Guenther Wegscheider; Gerhard Woess, both of Graz, all of Austria

[73] Assignee: AVL Gesellschaft fuer Verbrennungs-kraftmaschinen und Messtechnik m.b.H., Prof. Dr. Dr. h.c. Hans List, Austria

[21] Appl. No.: 401,822

[22] Filed: Sep. 1, 1989

[30] Foreign Application Priority Data

Sep. 2, 1988 [AT] Austria .................................. 2171/88

[51] Int. Cl.$^5$ .............................................. H03F 3/191
[52] U.S. Cl. ....................................... 330/107; 330/306
[58] Field of Search ................... 330/9, 107, 109, 294, 330/306, 302, 311

[56] References Cited

U.S. PATENT DOCUMENTS 4,117,412 9/1978 Holman, II ........................ 330/107
4,275,357 6/1981 Nakayama et al. ................. 330/107

Primary Examiner—Steven Mottola
Attorney, Agent, or Firm—Hill, Van Santen, Steadman & Simpson

[57] ABSTRACT

A charge amplifier circuit comprising an operational amplifier unit whose signal output is back to a signal input of the amplifier unit via a capacitative feedback element, the signal output of the operational amplifier unit also being coupled to an input of a following, further transmission unit that has a proportional, integrating transfer characteristic with a break-over frequency that is at least approximately equal to the break-over frequency of the operational amplifier unit, this being at least in the proximity of the break-over frequency defined by the feedback element of the operational amplifier unit. The feedback element of the operational amplifier unit can be optimized independently of the operating frequency range, this, allowing for a low resistance value for the feedback element given a transfer behavior that remains linear, this despite the low capacitor value that increases the charge sensitivity.

7 Claims, 2 Drawing Sheets

CHARGE AMPLIFIER CIRCUIT

BACKGROUND OF THE INVENTION

The present invention is directed to a charge amplifier circuit comprising an operational amplifier (op amp) having a signal output that is fed back to a signal input of the op amp via a feedback element having a capacitor with a finite resistance.

Numerous charge amplifier circuits of this type are known and have significantly contributed to the current, broad application of piezo-electric metrology since deficiencies inherent in electrometer amplifiers were thus capable of being eliminated. The operational amplifier of such a circuit generally is constructed as a direct-current amplifier having optimally high, internal voltage amplification, whereby the polarity of the output voltage is opposite that of the input voltage and whereby an optimally high input resistance is realized. The output of the amplifier is capacitatively negatively fed back to an input of the op amp by means of a highly insulating capacitor (corresponding to a parallel RC element). As a result, the input impedance is practically eliminated but the high isolating resistance at the input is preserved.

Assuming ideal conditions are present, it follows that no voltage arises via transducers, cables and the like connected via the capacitance, so that the isolating resistor in the input circuit is not critical and the input capacitance has no influence on the output voltage. Furthermore, because the output voltage is directly proportional to the charge output by means of a transducer or the like, is directly proportional to the actual measured quantity to be identified, and is inversely proportional to the feedback capacitance, arbitrarily graduated measuring ranges are capable of being achieved in a simple way by connecting corresponding capacitance values.

Taking actual conditions into consideration (the internal amplification of the operational amplifier unit is not infinite but limited to values in the range from $10^5$ through $10^7$, only a maximum of about 100 T ohms [i.e., 100 Tera ($10^{12}$) ohms ] isolating resistances are possible both at the amplifier input as well as for the feedback capacitors; there are no input stages that exhibit absolutely no leakage current; etc.), certain disadvantages nonetheless derive in view of the measuring method or, respectively, of the structure of the circuit, these being felt in a particularly disturbing fashion especially in conjunction with precise (or sensitive) measurements or quasi-statistical measurements. One of the most critical of these disadvantages is based on the fact that the RC element (whether the resistance (R) is intentionally defined by an additional, corresponding resistor that lies parallel to the capacitor or, on the other hand, is only defined by the internal resistance of the capacitor is inconsequential) serving for the capacitative feedback of the operational amplifier unit establishes a break-over frequency in the transmission behavior of the charge amplifier circuit. The circuit then is placed under a operating frequency range within a certain safety margin in the interest of maintaining an optimal linear transmission behavior. In view thereof, extremely low frequencies are eliminated from consideration anywhere in the standard measurements of such arrangements.

The necessity of making the product R*C of the operational amplifier feedback optimally high thus directly derives from the foregoing. Since an increase in the size of the feedback capacitor reduces the charge sensitivity of the circuit in practically inversely proportional fashion, the only possibility that remains is to make the resistance in the feedback circuit as high as possible. According to the present state of the art, as mentioned, values of resistance of a maximum of about 100 T ohm can be realized in this context—but this only under the most favorable conditions and given the assistance of careful, manual re-working of the circuit formatting. Apart from the fact that these high resistance values cannot be reproduced without a great amount of effort or, are not durable, disadvantages such as higher and higher resistance noise given higher values of resistance as well as dependency of the charge voltage transmission of the operational amplifier unit on the relationship between feedback resistance and input resistance also derive. See, for example, "Tichy, Gautschi, Piezoelektrische Messtechnik, Springer-Verlag, Berlin, Heidelberg, N.Y., 1890", particularly Chapter 12.

SUMMARY OF THE INVENTION

The present invention provides an improved charge amplifier circuit of the type described above. It is an object of the present invention to provide a charge amplifier circuit of this type such that the disadvantages, discussed above, are avoided and such that, in particular, a possibility of obtaining optimally great operating frequency ranges, given high charge sensitivity and simple realizability of the circuit arrangement, is provided in a simple way.

To this end, the present invention provides in an embodiment that the signal output of the operational amplifier unit is coupled to the input of a following, further transmission unit that exhibits a proportional-integrating transfer characteristic having a break-over frequency $f_{II}$ that is at least approximately equal to a break-over frequency $f_I$, the break-over frequency $f_I$ ($f_I = 1/(2*RC)$) being determined by the feedback element of the operational amplifier unit. The direct result of this simple embodiment, as shall also be set forth below with reference to a preferred exemplary embodiment, is that the position of the break-over frequency $f_I$ defined by the feedback RC element of the operational amplifier unit of the actual charge amplifier relative to the operating frequency range is not critical at all, so that both the R (resistance) as well as the C (capacitance) in the feedback of the operational amplifier unit can be arbitrarily optimally defined within broad limits, independently of one another. With a correspondingly low value of C, for example, a high charge sensitivity of the charge amplifier circuit can thus be effected, as is desireable for measuring low charges, without the value for R having to thus be increased as a counter-measure.

In the charge amplifier circuit of the invention, thus, the value R of resistance in the feedback circuit of the operational amplifier unit can be limited to values up to about 100 k ohm, this having the advantage that such resistances can be unproblematically precisely realized and reproduced. Given a value for R that is smaller than or only a few order of magnitude greater than the input resistance of the operational amplifier or, respectively, the isolating resistor of the connected charge generator or, respectively, of the signal lead, the charge voltage transmission of the operational amplifier unit is independent of the effective resistances and capacitances (isolating resistors, cable capacitances) that lie between the inputs thereof. Since the resistance noise caused by the resistance R—whether intentionally realized or effected by the finite isolating values—decreases for lower values of R, a resistance in, for example, the kilo ohm range is, of course significantly more advantageous, particularly for measuring low amounts of charge. Further, the creeping effect caused by the feedback capacitor of the operational amplifier unit in traditional charge amplifier circuits can be greatly suppressed by the free selection of the break-over frequency $f_I$ within broad limits, so that a charge amplifier that is far superior to the traditional arrangements in view of sensitivity, useable working frequency range, linearity, and structure. Manufacture can be realized overall with the circuit arrangement of the invention in the simplest way possible.

In an especially preferred embodiment of the invention, the two break-over frequencies $f_I$ and $f_{II}$ lie above the operating frequency range that is of primary interest; whether this is inside or outside the maximally possibly frequency range is thereby inconsequential for the reasons recited above. It is thus assured that slight linear deviations in the region of the break-over frequencies that may remain as a consequence of circuit elements that are not completely matched, or the like, remain without immediate effect on the measurement. Moreover, the product $R*C$ is small, this yielding the advantages in view of the circuit structure that were already addressed in detail above.

In a preferred embodiment of the invention, the following transmission unit comprises a further operational amplifier unit whose output is fed back into the input via a capacitor $C_1$ connected in series with a resistor $R_1$. This yields an extremely simple, analog embodiment of the following transmission unit that, while involving extremely little outlay, yields a charge amplifier circuit that exhibits all of the stated advantages of the invention and, moreover, can be realized in an extremely cost-beneficial way.

In a further embodiment of the invention, at least the further operational amplifier unit of the following transmission unit can be executed monolithically integrated together with the operational amplifier unit and the feedback capacitor C, whereby the capacitor $C_1$ and one of the two resistors R, $R_1$ are externally connected as balancing resistor. The only significant reason why charge amplifiers could not be executed as integrated circuits up to now is because of the initially addressed problem of the extremely high resistances in the feedback circuit of the operational amplifier unit. Since these resistances can be reduced to values, with an embodiment of the invention, that can also be unproblematically governed in integrated fashion, the said, extremely advantageous fashioning of the charge amplifier circuit can now be realized. Insofar as a subsequent balancing is not required for various purposes, of course, the entire charge amplifier circuit including $R_1$ and $C_1$ can be executed in an integrated circuit.

In a further development of the invention, the following transmission unit can be constructed with digital circuit technology or, can be executed monolithically integrated with the operational amplifier unit in accordance with the aforementioned construction. Given a following transmission unit realized in analog fashion, this "proportional-integrating" transmission unit is actually a phase-reducing element (LAG) as a consequence of the limited isolating resistance of the feedback capacitor $C_1$ and this phase-reducing element can also be referred to in general as a rational transmission element of the first order. Given digital execution of the following transmission unit under discussion here, however, an ideal PI (proportional-integrating) unit can also be executed over the entire operating frequency range, this offering advantages for various applications.

It is provided in a further embodiment of the invention that it is extremely advantageous for various applications that an offset drift compensation means be interposed between the operational amplifier unit and the following transmission unit. Such compensation means are intrinsically known, for example from Austrian patent No. 377,132 or, respectively, from EP-A1 253 016, and provide for compensation of the null drift of the measured signal—usually during the individual measuring phases.

The invention shall be set forth in yet greater detail below with reference to signal diagrams and exemplary embodiments schematically shown in the drawings and the accompanying detailed description of the presently preferred embodiments.

DETAILED DESCRIPTION OF THE PRESENTLY PREFERRED EMBODIMENTS

Figure 1:
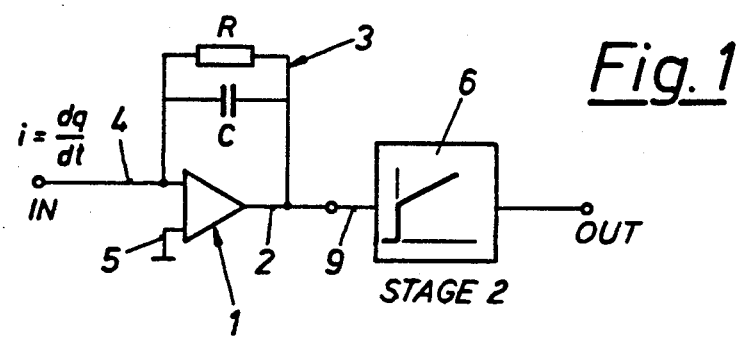
FIG. 1 is a schematic illustration of a circuit embodying principles of the invention.

In FIG. 1 there is illustrated a fundamental circuit diagram of a charge amplifier circuit embodying principles of the invention. The circuit comprises a first stage including an operational amplifier unit 1 whose signal output 2 is fed back to a signal input 4 via a parallel feedback RC element 3. A further input 5 of the operational amplifier unit 1 is tied to ground.

The operational amplifier unit 1 is shown in an inverting execution; for the purposes of the present invention, however, it is of no consequence whether an operational amplifier unit connected in inverting fashion or in non-inverting fashion is involved. For the sake of completeness, it is similarly pointed out that all of FIGS. 1 through 5 only schematically illustrate the respective circuits with the parts that describe the functions thereof—bias, supply, and protective circuits, and the like have been omitted for the sake of simplicity and clarity.

Figure 7:
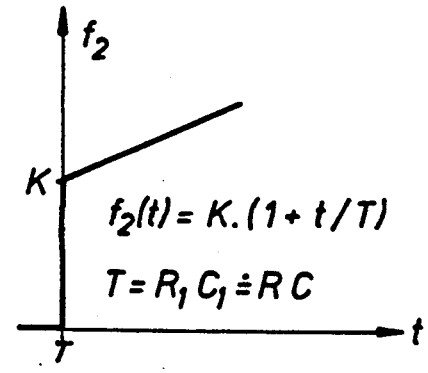
FIG. 7 is a graph illustrating signal transfer response characteristics of a following transmission unit employed in any of the circuits illustrated in FIGS. 1-5.

A following, further transmission unit 6 is illustrated as a second stage in the circuit of FIG. 1 and is only symbolically shown by means of its characteristic transfer response. The transfer response of a PI (proportional-integrating) element is shown in FIG. 7. The rise of the straight line for t (time) greater than 0 is equal to K/T, whereby K is a proportionality factor. The time constant T defines the break-over frequency of the PI element that has been repeatedly addressed is determined by $R_1*C_1$ given, for example, the analog embodiments shown in FIGS. 2 and 5. This time constant should be at least approximately equal to the R*C product of the first stage—i.e. of the operational amplifier unit 1; i.e. $R*C = R_1*C_1$ should apply.

Figure 2:
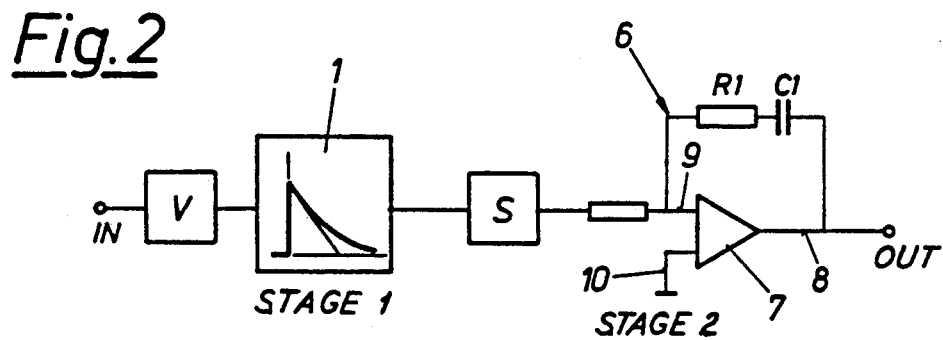
FIG. 2 is a schematic illustration of another circuit embodying principles of the invention.

The operational amplifier unit 1 of FIG. 1 is only shown by means of its typical transfer response in FIG. 2 and is referred to as the first stage. The following, further transmission unit or, respectively, the second stage is again identified by the numeral 6 and is shown in an analog execution. The further, following transmission unit 6 essentially comprises a further operational amplifier unit 7 whose output 8 is fed back to an input 9 of the op amp 7 via a capacitor $C_1$ connected in series with a resistor $R_1$. A further input 10 of the operational amplifier 7 is also tied to ground. All that was stated regarding FIG. 1 with respect to the fashioning of the op amp 1 as inverting or as non-inverting applies to the circuit of FIG. 2 as well.

A circuit element S can be positioned between the first and second stages and can, for example, be an offset drift compensation means for minimizing the offset voltage drift. In general, however, the circuit element referenced S is any signal conditioning means. A unit V comprises a means for preconditioning the input signal (for example, for input fuse protection, etc.) that is input into the op amp 1.

All that was stated above likewise applies with respect to the values of $R_1$ and $C_1$ in FIG. 2 or, respectively, with respect to the break-over frequency of the following, further transmission unit 6 thereby defined.

Figure 3:
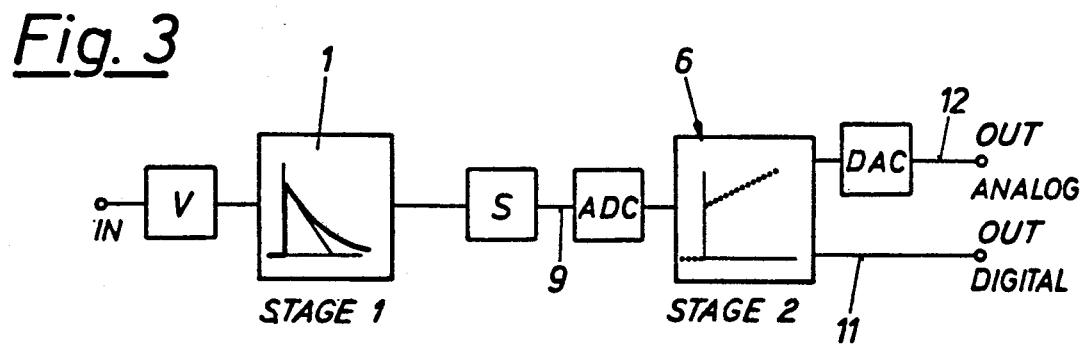
FIG. 3 is a schematic illustration of yet another circuit embodying principles of the invention.

In FIG. 3, the operational amplifier unit 1 or first stage 1, is again depicted by means of the transfer response graph, as in FIG. 2. The following, further transmission unit 6 or second stage 6 is illustrated as a digital realization. Following the first stage, the signal is conditioned in analog fashion, this ensuing in the circuit element S. This element S here can advantageously contain, for example, both amplification as well as an aliasing filter. This is followed by an analog-to-converter (ADC). As mentioned, the digital PI element or, respectively, the following transmission unit 6 is indicated by the dotted transfer response here. Depending on the type of embodiment of the charge amplifier circuit, this unit can then directly proceed to a digital output 11 or—additionally as warranted—an analog output signal is offered at the output 12 via a digital-to-analog converter (DAC).

Figure 4:
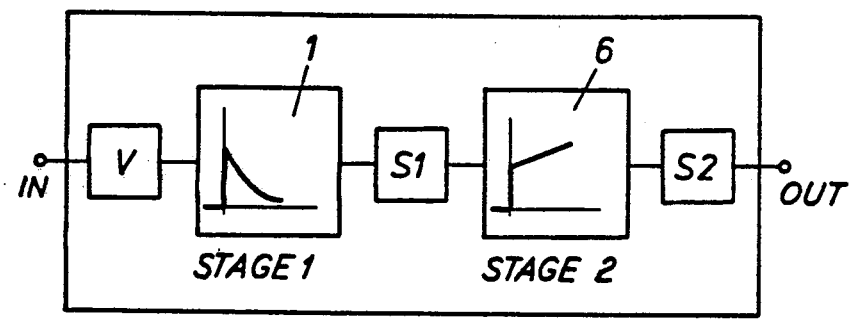
FIG. 4 is a schematic illustration of a further circuit embodying principles of the invention.

FIG. 4 illustrates a completely monolithically integrated embodiment of the charge amplifier circuit, whereby the operational amplifier unit, or respectively, first stage 1 as well as the following transfer unit or, respectively, second stage 6 are indicated only by means of their typical transfer response. The letter V again identifies a means for pre-conditioning the input signal. The means referenced S1 can comprise an intermediate amplification, control or filter function. The means S2 can contain output signal conditioning (ADC, DAC, formatting, etc.). Whether the further transmission unit or, respectively, second stage 6 is realized in analog or digital fashion is inconsequential here.

Figure 5:
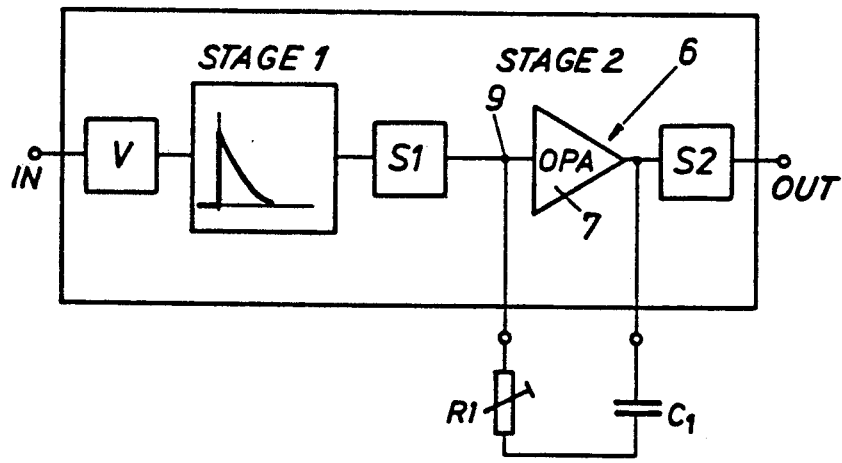
FIG. 5 is a schematic illustration of yet a further circuit embodying principles of the invention.

FIG. 5 illustrates an embodiment of the charge amplifier circuit fashioned partly monolithically integrated, whereby the following, further transmission unit 6 is executed in analog fashion and wherein the capacitor $C_1$ and a variable resistor $R_1$ are externally connected for achieving a high time constant of the overall system, this being defined by the capacitor $C_1$ and by the isolating resistor that acts parallel thereto.

Figure 6:
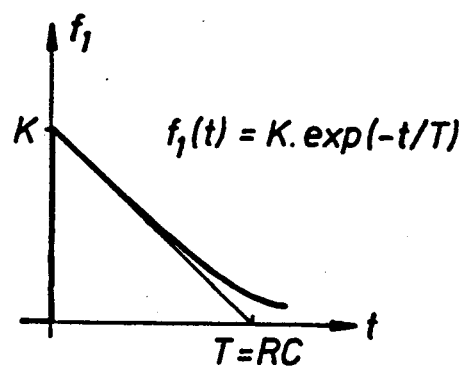
FIG. 6 is a graph illustrating signal transfer response characteristics of an operational amplifier employed in any of the circuits illustrated in FIGS. 1-5.

As mentioned, FIGS. 6 and 7 illustrate typical transfer responses of the operational amplifier unit 1 or, respectively, first stage (FIG. 6) and of the following, further transmission unit 6 or, respectively, second stage (FIG. 7) together with the calculating formulas that are of significance in this context.

While preferred embodiments have been shown, modifications and changes may become apparent to those skilled in the art which shall fall within the spirit and scope of the invention. It is intended that such modifications and changes be covered by the attached claims.

We claim as our invention:

1. A charge amplifier circuit having an input and an output, comprising:
   (a) a first stage including an operational amplifier having a signal output that is fed back to a signal input of the operational amplifier via a feedback element including a capacitor and which exhibits a finite resistance, the feedback element defining a break-over frequency $f_I$ defined as $\frac{1}{2}\pi RC$ where R is the resistance of the feedback elements and C is the capacitance of the feedback element, the signal input serving as the input of the charge amplifier circuit;
   (b) a second stage including a proportional-integrating (PI) unit having an input coupled to the signal output of the operational amplifier and an output that serves as the output for the charge amplifier circuit, the PI unit having a break-over frequency $f_{II}$, the frequency $f_{II}$ being substantially equal to the frequency $f_I$; and
   (c) whereby, no signal proportional to the output of the second stage is fed back to the signal input of the first stage.

2. A charge amplifier circuit, comprising:
   (a) a first stage including an operational amplifier having a signal output that is fed back to a signal input of the operational amplifier via a feedback element including a capacitor and which exhibits a finite resistance, the feedback element defining a break-over frequency $f_I$ defined as $1/(2\pi RC)$ where R is the resistance of the feedback element and C is the capacitance of the feedback element; and
   (b) a second stage including a proportional-integrating (PI) unit having an input coupled to the signal output of the operational amplifier, the PI unit having a break-over frequency $f_{II}$, the frequency $f_{II}$ being substantially equal to the frequency $f_I$, the PI unit comprising a further operational amplifier having a signal output that is fed back into the input of the PI unit via a feedback element comprising a resistor and a capacitor connected in series.

3. The charge amplifier circuit of claim 2, wherein the operational amplifier of the PI unit is formed and monolithically integrated with the operational amplifier and feedback element of the first stage, the feedback element of the second stage being externally connected.

4. The charge amplifier circuit of claim 1, wherein the PI unit is constructed as a digital unit.

5. The charge amplifier circuit of claim 4, wherein the PI unit is constructed and monolithically integrated with the operational amplifier of the first stage.

6. The charge amplifier circuit of claim 1, further comprising an offset drift compensation unit interposed between the operational amplifier of the first stage and the PI unit of the second stage.

7. A charge amplifier circuit having an input and an output, comprising:
 (a) a first stage comprising a charge amplifier, the charge amplifier comprising an operational amplifier with an input that serves as the input for the charge amplifier circuit and an output coupled to the input via a feedback element, the feedback element having an impedance defining a break-over frequency $f_I$ for the charge amplifier;
 (b) a second stage comprising a proportional integrating (PI) unit having an input coupled to the output of the charge amplifier and an output that serves as the output for the charge amplifier circuit, the PI unit having a break-over frequency $f_{II}$ that is substantially equal to the break-over frequency $f_I$; and
 (c) whereby, no signal proportional to the output of the second stage is fed back to the input of the first stage.

\* \* \* \* \*